United States Patent [19]
Ohmart et al.

[11] Patent Number: 5,589,765
[45] Date of Patent: Dec. 31, 1996

[54] METHOD FOR FINAL TESTING OF SEMICONDUCTOR DEVICES

[75] Inventors: Dale V. Ohmart, Fulshear; Willie B. Benitez, III, Wylie, both of Tex.; Deogracias D. Marrero, Baguio City, Philippines; Douglas J. Mirizzi, Rosenberg, Tex.

[73] Assignee: Texas Instruments Incorporated, Dallas, Tex.

[21] Appl. No.: 368,683

[22] Filed: Jan. 4, 1995

[51] Int. Cl.⁶ .................................................. G01R 31/02
[52] U.S. Cl. ........................................ 324/158.1; 324/72.5
[58] Field of Search ................................ 324/158.1, 26, 324/56, 73.1, 72.5; 364/483

[56] References Cited

U.S. PATENT DOCUMENTS

| | | | |
|---|---|---|---|
| 3,039,604 | 6/1962 | Bickel et al. | 324/26 |
| 3,665,504 | 5/1972 | Silverman | 324/26 |

*Primary Examiner*—Kenneth A. Wieder
*Assistant Examiner*—Barry C. Bowser
*Attorney, Agent, or Firm*—Robert D. Marshall, Jr.; James C. Kesterson; Richard L. Donaldson

[57] ABSTRACT

A method is provided for more efficiently and inexpensively testing semiconductor devices by an automated process of monitoring the performance of the test equipment and certifying that it is working properly, both before and after the actual tests of the devices are conducted. If the automated process can certify that the test equipment was working properly, prior and subsequent to the actual tests of the devices, then it can be assumed that the actual tests were performed correctly and the results are valid. Those devices that "passed" the actual tests are then ready for the next step in the fabrication process, or typically ready to be shipped to the customer. If the test equipment's performance degrades significantly during the actual tests, then the results of the actual tests are considered invalid. Consequently, the test equipment can be repaired or recalibrated and all of the devices retested.

18 Claims, 2 Drawing Sheets

METHOD FOR FINAL TESTING OF SEMICONDUCTOR DEVICES

TECHNICAL FIELD OF THE INVENTION

This invention relates generally to the process of testing semiconductor devices, and more particularly, to a method for final testing of semiconductor integrated circuits.

BACKGROUND OF THE INVENTION

Semiconductor devices, such as integrated circuits (ICs), are tested physically and/or electrically at numerous intervals during the overall fabrication process. However, the more critical tests of semiconductor devices are conducted during the latter portions of the fabrication and assembly processes. These test processes are commonly referred to as quality assurance (QA) tests and final testing of the devices. For ICs, these QA and final tests typically occur after the wafer fabrication and assembly processes, or when the IC chip is fully assembled or otherwise considered complete. Typically, during a QA or final test process, the static and dynamic electrical performance characteristics of each assembled semiconductor device are tested to ensure that the device meets stringent design requirements and customer specifications. Those devices that pass these final tests are then theoretically ready to be packaged and shipped to the customers.

Semiconductor manufacturers that use existing final test processes typically test the assembled or completed semiconductor devices by lots (about 1,000 devices/lot). Each device in the lot is passed through an automated or semi-automated test system, which contains equipment that measures the device's AC, DC and parametric or dynamic electrical performance characteristics. The test equipment compares each device's performance characteristics with established design criteria and/or customer requirements, and sorts the devices according to the results. Generally, the devices are sorted according to their having "passed" or "failed" the tests. In many instances, final testing also includes physical testing of the assembled devices.

As discussed above, the devices that "pass" these tests are ready to be packaged and shipped to the customers. However, given the high number of devices under test and the possibility that the test equipment may have been defective or improperly calibrated during all or a portion of the test process, a standard practice has been to shelve the "passed" devices temporarily and later retest all or a statistical sample of the "passed" devices. If the results of the retesting process correlate with the results of the original tests, then this correlation allows the assumption that the original tests were completed with no equipment errors or other testing related problems. Consequently, it is then assumed that the original sets of tests must have been correct, and the "passed" devices may then be packaged and shipped. As an alternative to the above-described process of retesting "passed" devices, a random sample is selected from each lot of devices that have been tested. These devices (typically between 5% to 25% of the lot) are then retested. The results of the retests are correlated with the original results, again in order to verify that the test equipment had operated properly during the original tests. This process of retesting samples of lots or just samples of "passed" devices, for tester verification purposes, is commonly referred to (in quality assurance parlance) as the Lot Accept Test process.

A significant problem encountered with the existing Lot Accept Test process is that typically at least four to five lots must be shelved before an acceptable number of "passed" devices are available to provide an adequate base for sampling and retesting. This process of shelving lots wastes a significant amount of time and causes a production logjam that slows down the overall device assembly and final test processes. Unfortunately, the existing final test processes do not increase the quality of the devices, which could have compensated somewhat for the losses in productivity. Moreover, the rehandling of devices during the retest processes can, by itself, cause an increase in the amount of defective devices or at least additional quality assurance risks. One alternative is to purchase additional test systems to increase productivity, but this equipment is very expensive and still does not increase the quality of the devices being manufactured. Also, sophisticated random sampling techniques are used that increase productivity slightly, but such statistical sampling techniques still allow a significant number of defective devices to pass through the test process undetected. Furthermore, since the existing processes sample and retest devices, if actual tester equipment failures are not identified immediately, then several lots of defective ICs can be "passed" before the equipment failure is identified. Nevertheless, the semiconductor industry has long justified the existing Lot Accept Test process with the questionable philosophy that a defective test system is more likely to fail a good lot than pass a bad one.

FIG. 1 is a diagram depicting a typical automated test system that is used for final testing of semiconductor ICs. Test system 1 includes three main components: an automated tester 2, a device-under-test (DUT) interface unit 4 (commonly referred to as a load board), and a device handler 8. Tester 2, which includes a digital processor and associated electronics, is software driven. The tester is physically and electrically connected to the load board 4. The operating surface of the load board is located proximate to the handler 8. Simplistically speaking, the handler places each device under test into an electrical socket located on the operating surface of the load board. The load board contains the electronic circuits that generate the test voltages and signals for the device connected to the socket. Tester 2, under the control of resident software routines, controls the operating environment of the tests (e.g., handler test temperature, soak time, etc.), provides digital instructions to, and receives test data from, the load board circuits and thus determines the performance or quality of each device being tested. The tester sends sorting instructions, via a data/command communications line 6, to the handler. Based on the results of the tests, the tester instructs the handler to convey each tested device to the appropriate output portion (e.g., "pass" or "fail" portion) of the sort/unload section 9 of the handler.

FIG. 2 illustrates the flow of an existing Lot Accept Test process used for final testing of semiconductor devices. At the onset (step 20), an operator determines whether the tester 2 (FIG. 1) has been calibrated and is otherwise available to begin the testing process. If the tester is not released, then the test process stops (step 30). Once the tester has been released for testing, the lot to be tested is loaded into the handler (step 40). After the devices are loaded, the operator initiates the actual test process (step 50). After testing of the lot is completed (step 60), the devices that "passed" should be ready for shipping (step 80) but are "shelved," while either all or a random sample of the devices that "passed" are retested (step 70). As discussed above, the results of the sampling and retesting process are used to verify that the test equipment was operating properly during the original tests.

Following the retesting, passing devices are packed and shipped (step 80). However, as discussed above, there are numerous problems with the existing QA and final test processes.

SUMMARY OF THE INVENTION

Accordingly, a need exists in the semiconductor device manufacturing industry for a more efficient, less costly process for quality assurance testing and/or final testing of semiconductor devices. In accordance with the present invention, a method is provided for more efficiently and inexpensively testing semiconductor devices by an automated process of monitoring the performance of the test equipment and certifying that it is working properly, both before and after the actual tests of the devices were conducted. If the automated process can "certify" that the test equipment was working properly, both prior and subsequent to the actual tests of the devices, then it can be assumed that the actual tests were performed correctly and the results are valid. Those devices that "passed" the actual tests are then ready for the next step in the fabrication process, or typically ready to be shipped to the customer. If, however, the test equipment's performance degrades significantly during the actual tests, then the results of the actual tests are considered invalid. Consequently, the test equipment can be repaired or recalibrated and all of those devices retested.

An important technical advantage of the present invention is that by avoiding the requirement to shelve and sample devices that have already been tested, the overall test cycle is reduced, which increases test efficiency and reduces overall manufacturing costs. Also, rehandling of the devices during the test process is minimized, which decreases the number of defective devices and avoids associated quality assurance risks. Another important technical advantage of the invention is that by monitoring and maintaining the performance of the test equipment throughout the test process, the need for additional test equipment is avoided. Yet another important technical advantage of the invention is that the likelihood of passing defective devices on to the customer, due to the use of defective test equipment, is substantially lower than for existing test processes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–4 of the drawings, like numerals being used for 1 ikeand corresponding parts of the various drawings.

Figure 3:
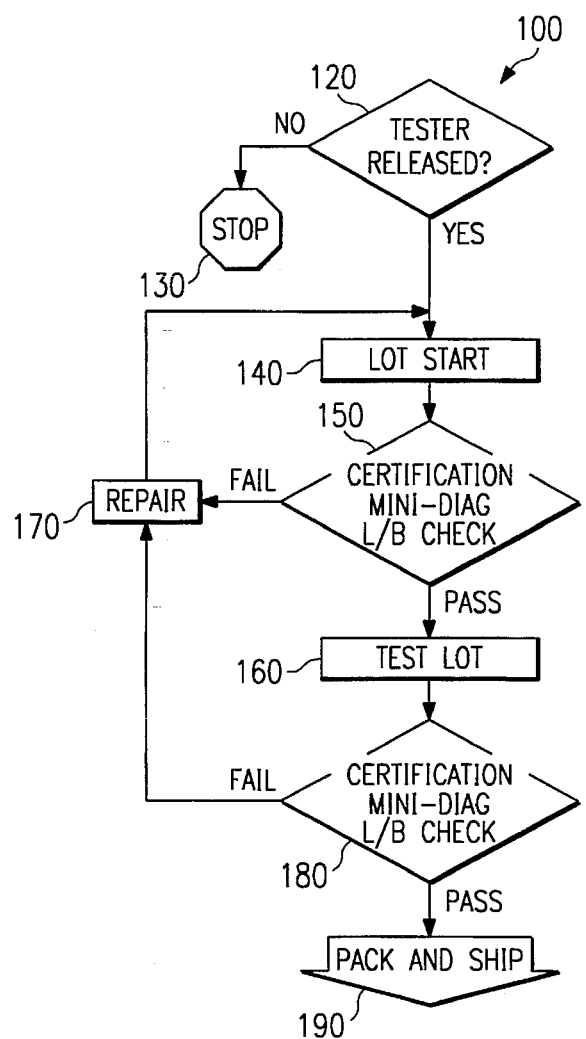
FIG. 3 is a flow diagram that illustrates a method of final testing semiconductor devices, in accordance with a preferred embodiment of the present invention.

FIG. 3 is a flow diagram that illustrates a sequence of steps that may be taken to perform a method of QA or final testing semiconductor devices, in accordance with a preferred embodiment of the present invention. In this embodiment, the final testing process may be referred to as a Lot Accept Certification Test process for semiconductor ICs. However, the concept of the invention is not intended to be so limited, and may include any test process in which a substantial amount (e.g., at or close to 100%) of a manufactured product is required to be tested. For example, the testing of critical military electronic components, or spacecraft and aircraft electronic components, may be performed using the present, unique process. This inventive concept could also apply, for example, to the rigorous tests of pharmaceutical products. Generically, the present test process may be referred to as a certification test process.

Figure 1:
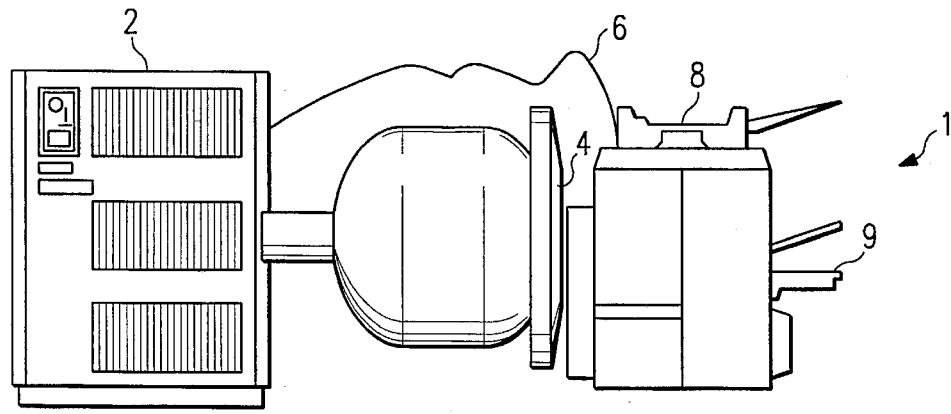
FIG. 1 is a diagram depicting an automated test system that is used for final testing of semiconductor ICs.
Figure 2:
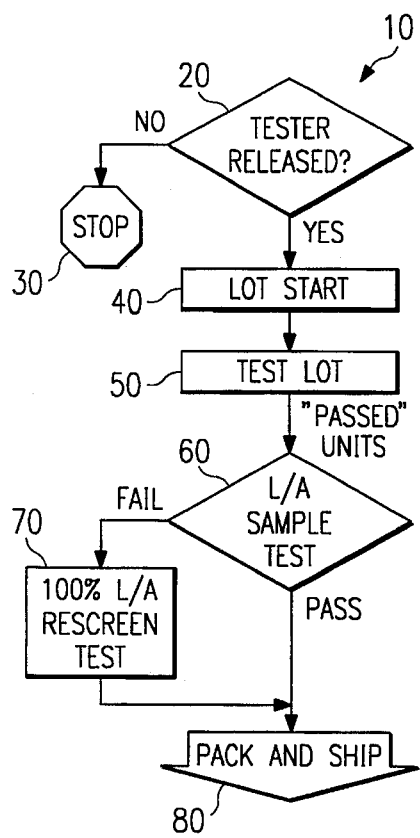
FIG. 2 illustrates the flow of an existing Lot Accept Test process used for final testing of semiconductor devices.

Referring to FIGS. 1 and 3, the certification test process 100 begins at step 120. An operator checks to determine whether the automated test system 1 has been "released" for testing purposes, or that the regularly scheduled diagnostic tests, calibrations and other routine maintenance procedures have been performed as required on the tester and handler. Test system 1 may be, for example, one of a number of automated, software driven test systems for semiconductor devices, such as a V-Series test system, a Polaris/Megaone test system, or a Teradyne test system. Such a system may include its own handler 8, or a separate handler may be used, which may be, for example, one of a number of automated handlers, such as a Delta Flex handler, a Delta RFS handler, a Multitest handler, or a Symtek KP handler. However, the specific type or make of automated tester or handler used is not a critical aspect of the present invention. If the tester is not released, then the test process stops (step 130). Next, after the test system has been "released," the operator loads the devices to be tested into handler 8 (step 140). The operator then initiates the actual tester (and handler) certification procedures in the process (step 150). As described below, the present certification test process is then automatically continued until the overall test process is completed.

At step 150, a number of mini-diagnostic tests are run on test system 1. These mini-diagnostics are software driven, and can be run automatically by tester 2 itself or, alternatively, for example, in a remote processor (not explicitly shown) which can be electronically coupled to the tester. The mini-diagnostic routines test the AC and DC performance characteristics of tester 2. As described in detail below, the AC and DC performance characteristics of the tester are measured and the tester's overall performance compared statistically to a predetermined set of "rules." If tester 2 fails any of these mini-diagnostic routines (e.g., violates a rule), then the tester is repaired or replaced (step 170) and the process returns to step 140. At this point, repair of the tester can include, for example, replacing a complete circuit board having a non-conforming or "failed" circuit, or even replacing complete circuit boards in which one or more circuits on the board are experiencing unacceptable "parametric drifting." Contemporaneously, the load board 4 circuits are tested and their performance also compared to a number of the predetermined set of "rules." At this point, non-conforming or "drifting" (failed) load board circuits are replaced as needed. Similar to tester failures, if a load board test is failed (150), then the overall test process is terminated and reinitiated at step 140. As will become evident, it is an important aspect of the present certification test process to maintain the integrity of the process once it has begun. Therefore, there should be no interruption of the test program from the onset of the process (step 140) to its end (step 190), when the devices have either "passed" the tests, are repaired and retested in another lot, or are to be discarded (unrepairable).

Figure 4A:
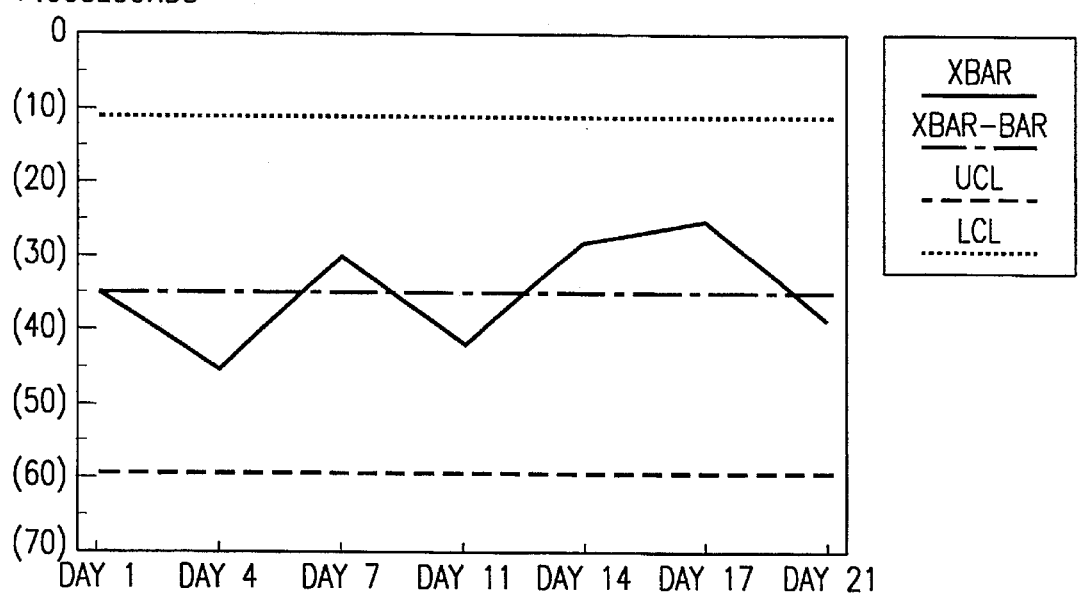
FIGS. 4a and 4b are graphs that illustrate statistically variations in test equipment performance over time, in accordance with a preferred embodiment of the present invention.
Figure 4B:
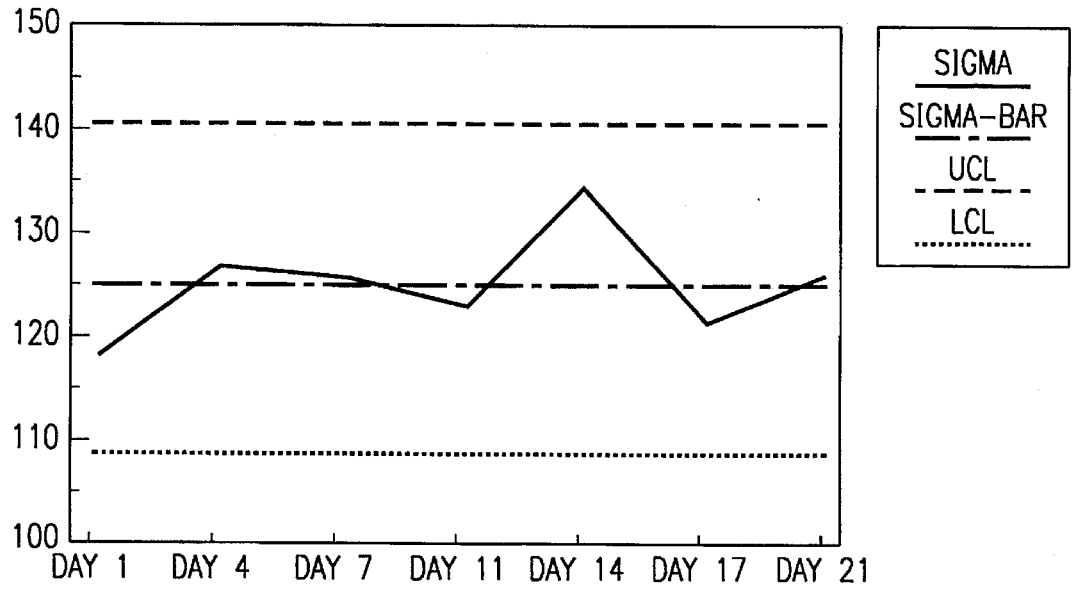

Continuing at step 150, once the tester and handler have passed the mini-diagnostic tests, the tester's (and handler's) AC and DC performance measurement data are collected and stored in a memory location. Controlled by the test program's software routines, the data are then compared statistically to a predetermined set of performance criteria. In a preferred embodiment, the tests to be performed on the semiconductor devices can require, for example, about 280 AC and 50 DC voltage measurements per pin. In other words, the tester measures the performance of a device by sensing the voltages present at each of the pins on the load board socket to which the device is electrically connected. The mean and standard deviation of the measured values for all of the tested devices are then calculated for that tester. For a 256 pin tester, for example, the total number of AC measurements thus provides about 72,000 points of data. The total number of DC measurements provides about 13,000 points of data. The means and standard deviations of these measurements are plotted over time. These means and standard deviations are processed and stored automatically by the digital processor monitoring the tester's (and handler's) electrical test performance. FIGS. 4a and 4b, respectively, show an X-bar chart and Sigma chart that illustrate how the individual performance measurements can be used statistically to monitor the overall electrical and parametric performance of the tester and handler. Each data point on the X (horizontal) axis represents the mean (on the X-bar chart) or the standard deviation (on the Sigma chart) of the measurements taken during each diagnostic test. For any number of measurements taken greater than 10, the statistical control limits for the mean (X-bar) can be calculated. These statistical upper control limits (UCL) and lower control limits (LCL) can be derived from the (1) mean of the mean (X-bar bar), (2) standard deviation of the mean (Sigma of X-bar), (3) mean of the standard deviation (Sigma bar), and (4) standard deviation of the standard deviation (Sigma of the Sigma) of the original test measurements, depending on the chart being used. If the mean (X-bar chart) or the standard deviation (Sigma chart) varies above the respective UCL or below the respective LCL, then the tester's performance is considered to be unacceptable and the tester is deemed to be not "in control" of the test process.

At this point, still at step 150, the measured data are retrieved from memory (not explicitly shown) and the specific pins and associated circuits that have degraded the overall performance of the tester are identified. The circuits associated with these "failed" pins are calibrated and the measurements are retaken. Subsequently, if the re-accumulated statistical data show that the means and standard deviations of the measurements are now between the predetermined control limits and thus acceptable, then the tester is considered to be "in control" of the test process, and the process proceeds to step 160, where the testing of a lot of actual devices can begin. If, however, after the "failed" pins have been calibrated, but the subsequently accumulated statistical data show that the means and standard deviations of the measurements are still not between the predetermined control limits, then the "failed" pin circuits are repaired or replaced (step 170), and the test process is returned to step 140 to begin again.

At step 160, the actual test program (software controlled) is initiated by the tester 2. In addition to controlling the test parameters at the load board circuitry, the test environment (temperature, etc.) and the device placement and sorting activities of the handler, the tester (or remote processor/test monitor, if used) monitors the system's overall performance. In a preferred embodiment of the invention, the performance of the test system (e.g., the tester, load board circuits, etc.) and the quality of the lot being tested are continually monitored by comparing the test data and other related information against a predetermined set of statistical "rules." If any of these rules is violated during the entire test process, then the performance of the test system and/or the quality of the lot is considered unacceptable, and remedial measures can be taken. If, for example, at some point in the overall process, the tester is deemed not to be "in control" of the test process (e.g., the tester's center of performance has drifted, "spread" or otherwise degraded), then the system is recalibrated and the lot completely retested. Preferably, this set of rules can be, for example, a modified version of the Western Electric Company (WECO) semiconductor test rules. However, the concept of the invention is not intended to be limited to any particular set of test rules. An important consideration for final testing of semiconductor products is that test system performance should be monitored consistently throughout the test process. The use of a modified WECO rule set allows the results of such monitoring to be used for quality assurance purposes consistently with a statistical approach. Compliance with these test rules is monitored automatically (preferably, continuously) by either the tester itself or a remote processor, under the control of application software developed by software and quality assurance artisans.

In a preferred embodiment, the first rule requires the software to independently verify that the correct test program is in use to test the assembled devices. This step can be performed, for example, by comparing the program name against a previously stored program identifier. This rule also requires that the same program is used, without interruption, throughout the complete lot test cycle. If the rule is violated, then the complete lot is retested.

The second rule requires the software to verify that the handler being used has an automated output sort control and is maintained in the automated mode. For example, the output sorter 9 must remain capable of being controlled automatically by sort instructions from tester 2. If the rule is violated, then the present lot accept certification test process is not to be performed and the lot accept test can be performed in its stead.

The third rule to be followed requires the software to verify that an appropriate communications protocol is being used for data and command communications between the tester and handler. In a preferred embodiment, an RS232 communications protocol providing two-way communications with error detection may be used for communications between tester 2 and handler 8 via line 6. However, the invention is not intended to be so limited and may utilize any appropriate media to communicate data and command instructions between the tester and handler. If the rule is violated, then the present lot accept certification test procedure is not to be performed and the lot accept test can be performed in its stead.

The fourth rule to be followed requires the software to verify that the device test temperature setting at the handler is equal to the temperature setting required by the test program. The tester senses the temperature setting at the handler and compares it to the temperature setting required by the test program. Preferably, the rule requires this procedure to be performed just prior to the start of the lot test, halfway through the lot test, and again at the end of the lot test. If the rule is violated just prior to the lot test process, such as, for example, during the device loading process, then the problem can be corrected by the operator and the lot test can be started. However, if this rule is violated during the lot test, or at the end of the test (e.g., just prior to the certification step 180), then the operator is to stop the lot test process, correct the problem, and then reinitiate testing of the complete lot (return to step 140).

The fifth rule to be followed requires the software to verify that the over- and under-temperature guardbands are set properly at the handler. In other words, tester 2 senses the temperature guardband settings at the handler and compares those settings with a predetermined value required by the test program, such as, for example, ±2° C. Similar to rule four, the fifth rule requires this procedure to be performed just prior to the start of the lot test, halfway through the lot test, and again at the end of the lot test. If the rule is violated just prior to the lot test process, such as, for example, during the device loading process, then the problem can be corrected by the operator and the lot test can be started. However, if this rule is violated during the lot test, or at the end of the test (e.g., just prior to the certification step 180), then the operator is to stop the lot test process, correct the problem, and then reinitiate testing of the complete lot (return to step 140).

The sixth rule to be followed requires the software to check the "soak time" of the handler. Preferably, the tester senses the "soak time" setting at the device soak chamber at the handler to verify that it is set to a predetermined value, such as, for example, a value greater than 180 seconds. Again, this rule requires this procedure to be performed just prior to the start of the lot test, halfway through the lot test, and again at the end of the lot test. If the rule is violated just prior to the lot test process, such as, for example, during the device loading process, then the problem can be corrected by the operator and the lot test can be started. However, if this rule is violated during the lot test, or at the end of the test (e.g., just prior to the certification step 180), then the operator is to stop the lot test process, correct the problem, and then reinitiate testing of the complete lot (return to step 140).

The seventh rule requires the software to verify that the handler has not initiated reprobing of the devices (i.e., placed any of the already tested devices again into a test socket). Again, this rule requires this procedure to be performed just prior to the start of the lot test, halfway through the lot test, and again at the end of the lot test. If the rule is violated just prior to the lot test process, then the problem can be corrected by the operator and the lot test can be started. However, if this rule is violated during the lot test, or at the end of the test (e.g., just prior to the certification step 180), then the operator is to stop the lot test process, correct the problem, and then reinitiate testing of the complete lot (return to step 140).

The eighth rule requires the software to verify continuously that the handler has not jammed. A handler jam may be defined as having occurred when the tester has not received a response from the handler for more than a predetermined time (e.g., 60 seconds). If a jam has occurred after any devices have been inserted into the temperature soak chamber at the handler, then positive action is to be taken. Otherwise, the test process may continue after the operator corrects the problem. If the jam is considered serious enough to place the test process "at risk," and has occurred just prior to the certification step 180, then the operator is to stop the lot test process, correct the problem, and then reinitiate testing of the complete lot (return to step 140). Otherwise, the problem can be corrected by the operator and the lot test can be continued.

The ninth rule requires the software to verify that the "handler bin count" of passed devices input by the operator, prompted from time to time by the tester, is equal to the tester's count of passed devices. If these counts are not equal, and this activity occurred just prior to the certification step 180, then the operator is to initiate retesting of the entire lot (return to step 140). Otherwise, the lot test process can be continued.

The tenth rule requires the software to verify that the total number of devices tested by the tester, is equal to the total number of devices that were inserted into the handler, as communicated via line 6 to the tester. If these numbers are not equal, and this activity occurred just prior to the certification step 180, then the operator is to initiate retesting of the entire lot (return to step 140). Otherwise, the lot test process can be continued and testing of the next lot can be started (return to step 120).

The eleventh rule requires the software to verify that the total number of devices tested before a "retest" is initiated, does not exceed by a predetermined number (e.g., 1) the number of "units to be tested" entered by the operator prior to the lot test process, or is not less than a predetermined number (e.g., 95%) of the number of the number of "units to be tested." This procedure is performed only once, at the end of the first test of the lot. If this rule is violated, and this procedure occurred just prior to the certification step 180, then the operator is to initiate retesting of the entire lot (return to step 140). Otherwise, the lot test process can be continued and testing of the next lot can be started (return to step 120).

The twelfth rule requires the software to verify that the "yield" is greater than a predetermined number (e.g., 80%). This "yield" value can be obtained from the "units to be tested" value entered by the operator, and the number of "passed units" sensed by the tester. If this "yield" value is not greater than the predetermined value, and this procedure occurred just prior to the certification step 180, then the operator is to discontinue testing with the lot certification test process, but may continue the next step with the lot accept test procedures.

The thirteenth rule requires the software to verify, at the time the devices are loaded into the handler, that the performance of the circuit boards in the load board meet predetermined requirements. If the performance of any circuit is not up to par, then the tester discontinues the test process, and the operator is to correct the problem. Once the problem is corrected, the lot test may be initiated.

The fourteenth rule requires the software to verify, halfway through the lot test process, that the performance of the circuit boards in the load board continue to meet the predetermined requirements. If the performance of any circuit is not up to par, then the tester discontinues the test process, the handler is unloaded, and the operator is to correct the problem. Once the problem is corrected, that lot's test is then reinitiated.

The fifteenth rule requires the software to verify, at the end of the lot test process, that the performance of the circuit boards in the load board still meet the predetermined requirements. If the performance of any circuit is not up to par, then the operator is to correct the problem. Once the problem is corrected, that lot's test is then reinitiated.

The sixteenth rule requires the software to verify, at the onset of the test process, that all of the load board circuits or channels used by the test program and identified as such at the time the test program was loaded, passed a basic, functional diagnostic test. If any such circuit or channel fails the basic diagnostic test, then the tester discontinues the test process, and the operator is to correct the problem (e.g., repair or replace the circuit board). Once the problem is corrected, then the lot test may be initiated.

The seventeenth rule requires the software to verify, halfway through the test process, that all of the load board circuits or channels used by the test program and identified as such at the time the test program was loaded, again passed a basic, functional diagnostic test. If any such circuit or channel fails this diagnostic test, then the tester discontinues the test process, the handler is unloaded, and the operator is to correct the problem (e.g., repair or replace the circuit board). Once the problem is corrected, then another diagnostic test is run and the entire lot test is reinitiated.

The eighteenth rule requires that the software verify, at the end of the lot test process, that all of the load board circuits or channels used by the test program and identified as such at the time the test program was loaded, again passed a basic, functional diagnostic test. If any such circuit or channel fails the diagnostic test at this point, then the operator is to correct the problem (e.g., repair or replace the circuit board). Once the problem is corrected, then another diagnostic test is run and the entire lot test is initiated.

The nineteenth rule requires the software to verify that the retest process, if undertaken, was executed properly by the software. If the retest process was not executed properly (e.g., compared to a predetermined set of procedures), and this procedure occurred just prior to the certification step 180, then the entire lot test is reinitiated (return to step 120). Otherwise, the lot test process may be continued by packing and shipping passing devices (step 190) and the next lot may be tested.

Although the present invention and its advantages have been described in detail, it should be understood that various changes, substitutions and alterations can be made herein without departing from the spirit and scope of the invention as defined by the appended claims.

What is claimed is:

1. A method for final testing a lot consisting of a predetermined plurality of semiconductor devices, comprising the steps of:

testing operation of a test system relative to a predetermined set of test system performance characteristics;

if said test system fails to operate in accordance with said predetermined set of test system performance characteristics, repairing said test system and retesting operation of said test system until said test system operates in accordance with said predetermined set of test system performance characteristics;

certifying that said test system is operating in accordance with said predetermined set of test system performance criteria;

testing a plurality of semiconductor device performance characteristics of each of said lot of semiconductor devices with said test system, said testing resulting in passing semiconductor devices operating in accordance with said plurality of semiconductor device performance characteristics and failing semiconductor devices not operating in accordance with said plurality of semiconductor device performance characteristics;

subsequent to said testing of said lot of semiconductor devices, testing operation of said test system relative to said predetermined set of test system performance characteristics;

if said test system fails to operate in accordance with said predetermined set of test system performance criteria subsequent to said testing of said lot of semiconductor devices repairing said test system and retesting operation of said test system until said test system operates in accordance with said predetermined set of test system performance characteristics, following repair of said test system restarting testing each of said lot of semiconductor devices and subsequent to said restart of testing of said lot of semiconductor devices retesting operation of said test system;

if said test system operates in accordance with said predetermined set of test system performance criteria subsequent to said testing of said lot of semiconductor devices, recertifying that said test system is operating in accordance with said predetermined set of test system performance criteria; and packing and shipping said passing semiconductor devices.

2. The method according to claim 1, wherein said certifying step further comprises comparing a plurality of test system performance characteristics with a predetermined set of statistical rules.

3. The method according to claim 1, wherein said certifying step further comprises comparing a plurality of test system performance characteristics with a plurality of modified WECO rules.

4. The method according to claim 1, wherein at least one of said predetermined set of performance criteria is certified during said step of testing.

5. A method for final testing of a lot of a predetermined number of semiconductor integrated circuits, comprising the steps of:

loading said lot of said semiconductor integrated circuits into a semiconductor device test handler;

measuring a plurality of tester performance characteristics of a semiconductor device tester coupled to said test handler;

measuring a plurality of test handler performance characteristics of said test handler;

comparing said plurality of tester performance characteristics to a predetermined set of tester criteria and said plurality of test handler performance characteristics to a predetermined set of test handler criteria;

if either said tester fails to operate in accordance with said predetermined set of tester criteria or said test handler fails to perform in accordance with said teat handler criteria, repairing said tester and said test handler and remeasuring said tester performance characteristic and said test handler performance characteristic until both said tester operates in accordance with said predetermined set of tester criteria and said test handler operates in accordance with said predetermined set of test handler criteria;

if both said tester operates in accordance with said predetermined set of tester criteria and said test handler operates in accordance with said predetermined set of teat handler criteria, measuring a plurality of semiconductor integrated circuit performance characteristics of each of said lot of said semiconductor integrated circuits with said tester;

sorting each of said lot of said semiconductor integrated circuits at an output of said test handler into passing and failing groups in accordance with said measured plurality of semiconductor integrated circuit performance characteristics;

remeasuring said plurality of tester performance characteristics subsequent to said measuring said plurality of semiconductor performance characteristics of said lot of semiconductor integrated circuits;

remeasuring said plurality of test handler performance characteristics subsequent to said measuring said plurality of semiconductor performance characteristics of said lot of semiconductor integrated circuits;

recomparing said remeasured plurality of tester performance characteristics to said predetermined set of tester criteria and said remeasured plurality of test handler performance characteristics to said predetermined set of test handler criteria;

if either said tester fails to operate in accordance with said predetermined set of tester criteria on remeasurement or said test handler fails to perform in accordance with said teat handler criteria on remeasurement, repairing said tester and said test handler and remeasuring said tester performance characteristic and said test handler performance characteristic until both said tester operates in accordance with said predetermined set of tester criteria and said test handler operates in accordance with said predetermined set of test handler criteria, and thereafter remeasuring said plurality of semiconductor integrated circuit performance characteristics of each of said lot of said semiconductor integrated circuits with said tester;

if both said tester operates in accordance with said predetermined set of tester criteria on remeasurement and said test handler operates in accordance with said predetermined set of teat handler criteria on remeasurement, then packing and shipping said semiconductor integrated circuits in said passing group.

6. The method according to claim 5, wherein said first and second predetermined set of criteria further comprise a plurality of statistical rules.

7. The method according to claim 6, further comprising the steps of:

repairing at least one of said handler and said tester if at least one of said measured second and third plurality of performance characteristics violates at least one of said plurality of statistical rules during the comparing step; and if said repairing step is performed, unloading said semiconductor integrated circuits from said handler and returning to said loading step.

8. The method according to claim 6, further comprising the steps of:

repairing at least one of said handler and said tester if at least one of said remeasured second and third plurality of performance characteristics violates at least one of said plurality of statistical rules during the recomparing step; and if said repairing step is performed, unloading said semiconductor integrated circuits from said handler and returning to said loading step.

9. The method according to claim 1, further comprising the steps of:

following testing of one half of said lot of semiconductor devices, testing operation of said test system relative to a at least one of said predetermined set of test system performance characteristics;

if said test system fails to operate in accordance with said at least one of said predetermined set of test system performance criteria repairing said test system and retesting operation of said test system until said test system operates in accordance with said predetermined set of test system performance characteristics, following repair of said test system restarting testing each of said lot of semiconductor devices and subsequent to said retesting of said lot of semiconductor devices retesting operation of said test system; and if said test system operates in accordance with said at least one of said predetermined set of test system performance criteria, continuing with testing of a second half of said lot of semiconductor devices.

10. The method of claim 9, wherein:

said at least one of said predetermined set of test system performance characteristics includes verification that said test system has a device temperature setting equal to a predetermined temperature.

11. The method of claim 9, wherein:

said at least one of said predetermined set of test system performance characteristics includes verification that said test system has device under-temperature and device over-temperature settings within a predetermined range of respective predetermined temperatures.

12. The method of claim 1, wherein:

said tester system conveys passing semiconductor devices into a pass bin;

said tester system maintains a count of passing semiconductor devices; and said test system periodically requests verification that said test system count of passing semiconductor devices equals a number of semiconductor devices in said pass bin;

if said test system count of passing semiconductor devices fails to equal said number of semiconductor devices in said pass bin repairing said test system and retesting operation of said test system until said test system operates in accordance with said predetermined set of test system performance characteristics, following repair of said test system restarting testing each of said lot of semiconductor devices and subsequent to said retesting of said lot of semiconductor devices retesting operation of said test system; and if said test system count of passing semiconductor devices equals said number of semiconductor devices in said pass bin, continuing with testing of said lot of semiconductor devices.

13. The method of claim 1, wherein:

said tester system maintains a count of passing semiconductor devices;

said testing operation of said test system subsequent to said testing of said lot of semiconductor devices includes comparing a ratio of said count of passing semiconductor devices to a number of semiconductor devices in said lot of semiconductor devices to a predetermined ratio;

if said ratio of said count of passing semiconductor devices to a number of semiconductor devices in said lot of semiconductor devices is less than said predetermined ratio repairing said test system and retesting operation of said test system until said test system operates in accordance with said predetermined set of test system performance characteristics, following repair of said test system restarting testing each of said lot of semiconductor devices and subsequent to said retesting of said lot of semiconductor devices retesting operation of said test system; and if said ratio of said count of passing semiconductor devices to a number of semiconductor devices in said lot of semiconductor devices is less than said predetermined ratio, continuing with other tests in said testing operation of said test system subsequent to said testing of said lot of semiconductor devices.

14. The method according to claim 5, further comprising the steps of:

following measuring said predetermined set of semiconductor integrated circuit performance characteristic of one half of said lot of semiconductor integrated circuits, making an intermediate remeasurement of at least one of said tester relative to at least one of said predetermined set of tester performance characteristics and said test handler relative to at least one of said predetermined set of test handler performance characteristics;

if either said tester fails to operate in accordance with said predetermined set of tester criteria on said intermediate remeasurement or said test handler fails to perform in accordance with said test handler criteria on said intermediate remeasurement, repairing said tester and said test handler and remeasuring said tester performance characteristic and said test handler performance characteristic until both said tester operates in accordance with said predetermined set of tester criteria and said test handler operates in accordance with said predetermined set of test handler criteria, and thereafter remeasuring said plurality of semiconductor integrated circuit performance characteristics of each of said lot of said semiconductor integrated circuits with said tester; and if both said tester operates in accordance with said predetermined set of tester criteria on said intermediate remeasurement and said test handler operates in accordance with said predetermined set of teat handler criteria on said intermediate remeasurement, continuing with testing of a second half of said lot of semiconductor integrated circuits.

15. The method of claim 14, wherein:

said at least one of said predetermined set of test handler performance characteristics includes verification that said test handler has a device temperature setting equal to a predetermined temperature.

16. The method of claim 14, wherein:

said at least one of said predetermined set of test handler performance characteristics includes verification that said test handler has device under-temperature and device over-temperature settings within a predetermined range of respective predetermined temperatures.

17. The method of claim 5, wherein:

said tester maintains a count of passing semiconductor integrated circuits; and said tester periodically requests verification that said tester count of passing semiconductor devices equals a number of semiconductor devices in said passing group;

if said tester count of passing semiconductor devices fails to equal said number of semiconductor devices in said passing group, repairing said tester and said test handler and remeasuring said tester performance characteristic and said test handler performance characteristic until both said tester operates in accordance with said predetermined set of tester criteria and said test handler operates in accordance with said predetermined set of test handler criteria, and thereafter remeasuring said plurality of semiconductor integrated circuit performance characteristics of each of said lot of said semiconductor integrated circuits with said tester; and if said tester count of passing semiconductor integrated circuits equals said number of semiconductor integrated circuits in said passing group, continuing with testing of said lot of semiconductor integrated circuits.

18. The method of claim 5, wherein:

said testing operation of said tester subsequent to said testing of said lot of semiconductor integrated circuits includes comparing a ratio of said count of passing semiconductor integrated circuits to a number of semiconductor integrated circuits in said lot of semiconductor integrated circuits to a predetermined ratio;

if said ratio of said count of passing semiconductor integrated circuits to said number of semiconductor integrated circuits in said lot of semiconductor integrated circuits is less than said predetermined ratio, repairing said tester and said test handler and remeasuring said tester performance characteristic and said test handler performance characteristic until both said tester operates in accordance with said predetermined set of tester criteria and said test handler operates in accordance with said predetermined set of test handler criteria, and thereafter remeasuring said plurality of semiconductor integrated circuit performance characteristics of each of said lot of said semiconductor integrated circuits with said tester; and if said ratio of said count of passing semiconductor integrated circuits to a number of semiconductor integrated circuits in said lot of semiconductor devices is less than said predetermined ratio, continuing with other tests in said testing operation of said test system subsequent to said testing of said lot of semiconductor devices.

* * * * *